(12) United States Patent
Song et al.

(10) Patent No.: US 8,775,885 B2
(45) Date of Patent: Jul. 8, 2014

(54) IEEE1588 PROTOCOL NEGATIVE TESTING METHOD

(75) Inventors: Xiao-hui Song, Xuchang (CN); Yong Wei, Xuchang (CN); Fu-sheng Li, Xuchang (CN); Quan-sheng Cui, Xuchang (CN); Jun-feng Di, Xuchang (CN); Jun-gang Li, Xuchang (CN); Yun-zhao Zheng, Xuchang (CN); Hong-guang Shi, Xuchang (CN); Tuo-fu Zheng, Xuchang (CN); Yi-ding Song, Xuchang (CN); Bao-shan Zhang, Xuchang (CN)

(73) Assignees: Xu Ji Group Corporation, Henan (CN); State Grid Corporation of China, Beijing (CN)

( * ) Notice: Subject to any disclaimer, the term of this patent is extended or adjusted under 35 U.S.C. 154(b) by 161 days.

(21) Appl. No.: 13/596,358

(22) Filed: Aug. 28, 2012

(65) Prior Publication Data
US 2013/0103997 A1 Apr. 25, 2013

(30) Foreign Application Priority Data
Aug. 30, 2011 (CN) .......................... 2011 1 0252894

(51) Int. Cl.
*G01R 31/28* (2006.01)
(52) U.S. Cl.
USPC ........................................................ 714/731

(58) Field of Classification Search
CPC ....... G01R 31/31727; G06F 1/12; H04J 3/06; H04J 3/14; H04J 3/0667; H04L 43/50
See application file for complete search history.

(56) References Cited

U.S. PATENT DOCUMENTS

| | | | |
|---|---|---|---|
| 8,559,951 B2 * | 10/2013 | Chen ............................. | 455/436 |
| 2005/0207387 A1 * | 9/2005 | Middleton et al. ............ | 370/347 |
| 2011/0019699 A1 * | 1/2011 | Sun et al. ...................... | 370/509 |
| 2012/0263220 A1 * | 10/2012 | Li et al. ......................... | 375/224 |

* cited by examiner

*Primary Examiner* — Guerrier Merant

(57) ABSTRACT

The present invention relates to an IEEE1588 protocol negative testing method, comprises steps of: connecting a IEEE1588 tester and a slave clock DUT to establish a real-time closed-loop feedback mechanism; taking the IEEE1588 tester as a master clock, and establishing a stable time synchronization with the slave clock DUT; obtaining the timing offset or path delay of the slave clock DUT before disturbance; assembling an abnormal message in a frame and sending it to the slave clock DUT; calculating the timing offset or path delay increment after disturbance of the abnormal message; determining whether there is a sudden change in the timing offset or path delay of the slave clock DUT, wherein if there is no sudden change, the test passes; otherwise the test fails. This testing method uses the field of correction field (correction Field) in the IEEE1588 message to "magnify" the response of the slave clock DUT to the abnormal message stimulus, and realizes a real-time closed-loop detection to efficiently verify whether the message processing logic of the slave clock DUT follows the IEEE1588 protocol.

8 Claims, 3 Drawing Sheets

IEEE1588 PROTOCOL NEGATIVE TESTING METHOD

CROSS-REFERENCE TO RELATED APPLICATIONS

This application is claims the priority benefit of Chinese application numbers: 201110252894.X , filed on Aug. 30, 2011, and the content of which is incorporated herein by reference.

BACKGROUND OF THE INVENTION

1. Field of the Invention

The present invention belongs to the field of relay protection automation in electrical power engineering, and in particular relates to an IEEE1588 negative testing method applicable to a slave clock device.

2. Background of the Invention

Since the smart substation requires a higher real-time performance, as well as the function of interactively collaborating with devices outside the substation, absolute time stamps are necessary. In a digital substation in which the process layer network adopts IEC61850 9-2, the IEEE1588 time synchronization is an applicable time synchronization. By using IEEE1588 timing, the dedicated timing network is omitted, the principle is simple, the implementation of the protocol takes up a small portion of the device resources, and the configuration is simple.

Currently, many electric power equipment manufacturers in our country have in succession launched research and production development regarding IEEE1588. The electric power companies have also carried out the interoperability test of IEEE1588 products. However, the conformity test of IEEE1588 protocol has just started in the industry of electric power. The key of the conformity test of IEEE1588 protocol is to optimize a conformity test case which has a comprehensive coverage, so as to efficiently find problems in realization of the IEEE1588 protocol.

The negative testing is opposite to the positive testing, and they are two important divisions in the test design. In simply words, the positive testing is to test whether the object under test have finished the job that it should have finished, while the negative testing is to test whether the object under test have not performed the job that it should have not performed. In some documents the negative testing is called as a negative test, and the positive testing is called as a positive test. The positive testing case for IEEE1588 conformity test is easy to design, while the negative testing which simulates abnormalities is hard to design. This results in that there are relatively less negative testing in the IEEE1588 conformity test, the test has a narrow coverage, and it is impossible to efficiently guarantee the reliability of time synchronization for the slave clock device. Therefore, it is necessary to design an IEEE1588 negative testing case which has a comprehensive coverage to efficiently guarantee the reliability of time synchronization for the slave clock device.

In the negative testing project of the IEEE1588 protocol, testing the influence of abnormal messages on the slave clock under test is an important negative testing project. This kind of negative testing project aims to verify whether the message processing logic of the slave clock under test is correct, i.e., the slave clock under test should ignore (i.e., should not process) abnormal messages, so as to guarantee the reliability of the slave clock synchronous. The existing testing method is to firstly assemble an abnormal message in a frame (the abnormal message means a message which is not correct in format or content) and then send it to the slave clock device under test (DUT), and observe the response from the slave clock device. Nevertheless, this testing method finds difficulties in practice. Although the abnormal message is sent to the slave clock DUT, the response from the slave clock DUT is not obvious, and it is also very difficult to judge whether the slave clock DUT have ignored the abnormal message according to analysis of message interactive process. The reason lies in that both synchronous calculation process and delay calculation process in IEEE1588 protocol are periodical. Whether a frame of message is ignored does not have significant influence on the slave clock synchronization. Even the slave clock DUT is out of synchronization, there will be a process in which the deviation increases gradually. In view of the case that the existing testing method is difficult to test whether the message processing logic of the slave clock under test is correct, it is necessary to modify the existing testing method so as to be adapted to the actual test.

BRIEF SUMMARY OF THE INVENTION

It is an object of the invention to provide an IEEE1588 protocol negative testing method for detecting whether the message processing logic is correct in case that a slave clock DUT receives an abnormal message.

According to the present invention, the IEEE1588 protocol negative testing method comprises the following steps:

(1) connecting a IEEE1588 tester and a slave clock DUT to establish a real-time closed-loop feedback mechanism;

(2) taking the IEEE1588 tester as a master clock, and establishing a stable time synchronization with the slave clock DUT;

(3) obtaining the timing offset or path delay of the slave clock DUT before disturbance through a real-time closed-loop feedback mechanism by the IEEE1588 tester;

(4) assembling an abnormal message in a frame by the IEEE1588 tester, and sending it to the slave clock DUT;

(5) obtaining the timing offset or path delay of the slave clock DUT after disturbance of the abnormal message through the real-time closed-loop feedback mechanism by the IEEE1588 tester;

(6) calculating the timing offset increment or path delay increment after disturbance of the abnormal message;

(7) according to the increment calculated in Step (6), determining whether there is a sudden change in the timing offset or path delay of the slave clock DUT, wherein if there is no sudden change, it indicates that the logic for the slave clock DUT to process the abnormal message is correct, and the check item in this time passes; otherwise it indicates that the logic for the slave clock DUT to process the abnormal message is not correct, and the check item in this time fails.

Furthermore, the real-time closed-loop feedback mechanism in step (1) is a pulse per second (PPS) feedback mechanism or an IEEE1588 management mechanism.

Furthermore, the IEEE1588 tester receives a GPS signal and obtains a reference PPS signal, the slave clock DUT has a PPS signal outputting interface, the PPS signal is introduced into the IEEE1588 tester, the IEEE1588 tester finds out real-time timing offset of the slave clock device by comparing the reference PPS signal and the PPS signal output by the slave clock device.

Furthermore, both the IEEE1588 tester and the slave clock DUT support the IEEE1588 management mechanism, and the IEEE1588 tester serves as an administrative client and can obtain the path delay of the slave clock DUT at any time by a getting operation GET command in the management mechanism.

Furthermore, if the slave clock DUT has a PPS signal outputting interface, the real-time closed-loop feedback mechanism selects the PPS feedback mechanism, and determines in step 7 whether there is a sudden change in the timing offset; and if the slave clock DUT supports the IEEE1588 management mechanism, said real-time closed-loop feedback mechanism selects the IEEE1588 management mechanism, and determines in step 7 whether there is a sudden change in the path delay.

Furthermore, during assembling an abnormal message in a frame in said step (4), apart from the error in the designed message itself, the field of correction field in the abnormal message is further assigned with an abnormal value, and once the slave clock DUT receives such an abnormal message which should have been ignored, the field of correction field will "magnify" the timing offset or path delay of the slave clock DUT.

Furthermore, determining whether there is a sudden change in the path delay or timing offset of the slave clock DUT in said step (7) means in case that the slave clock DUT is disturbed, that is, the abnormal message is inputted, the timing offset and path delay significantly differ from the normal case, and such a significant difference makes it possible for the IEEE1588 tester to easily identify through the real-time closed-loop feedback mechanism.

Furthermore, said sudden change means that the timing offset or path delay is higher after disturbance than before disturbance by at least one order.

The testing method of the present invention relates to a general framework for realizing the IEEE1588 negative testing. By inserting an abnormal message designed by a testing engineer, it is possible to verify the message processing logic whether is correct when the slave clock DUT receives the abnormal message, and to efficiently guarantee the reliability of time synchronization of the slave clock device. This testing method uses the field of correction field (correction Field) in the IEEE1588 message to "magnify" the response of the slave clock DUT to the abnormal message stimulus, and realizes a real-time closed-loop detection to efficiently verify whether the message processing logic of the slave clock DUT conforms the IEEE1588 protocol.

DETAILED DESCRIPTION OF THE INVENTION

Figure 1:
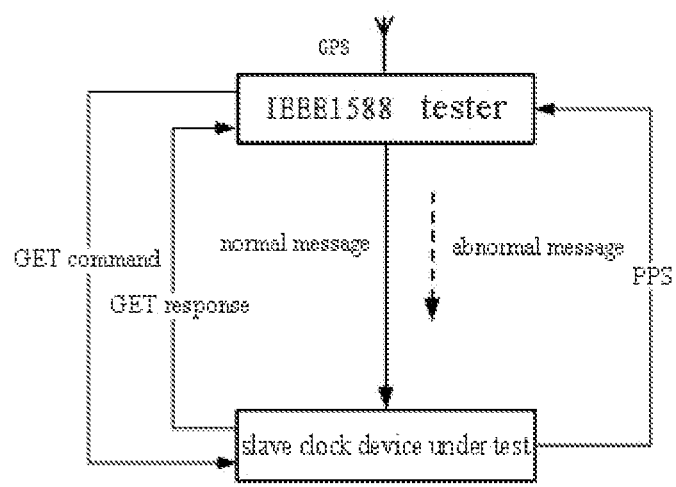
FIG. 1 is a diagram showing a testing system according to an embodiment.

The design ideas for realizing the IEEE1588 protocol negative testing method of the present application for invention are discussed as follow. The IEEE1588 tester sends an abnormal message to a slave clock DUT, and the field of correction field in the abnormal message is a specially designed abnormal value. If the slave clock DUT receives the abnormal message, the specially designed field of correction field in the abnormal message may significantly increase the timing offset and path delay of the slave clock DUT, and such a significant difference can be easily identified by the IEEE1588 tester by a real-time closed-loop feedback mechanism. By detecting whether there is a sudden change in the timing offset or path delay of the slave clock DUT, one can verify whether the message processing logic of the slave clock DUT is correct. The abnormal message can not only be a synchronous message or follow-up message sent by the IEEE1588 tester, but also a delayed response message of the IEEE1588 tester to respond the slave clock DUT.

The purpose for the IEEE1588 tester and the slave clock DUT to form a real-time closed-loop feedback is that the tester should be able to fast detect the change in the path delay or timing offset of the slave clock device. It is possible to form the real-time closed-loop mechanism by a PPS feedback mechanism or an IEEE1588 management mechanism.

When a delay request-response delay calculation mechanism (i.e., the commonly so-called E2E mode) and a two-step clock mode are adopted in a synchronous network, the path delay and timing offset of the slave clock device follow the equations described below:

$$\text{delay} = [(t_2 - t_1) + (t_4 - t_3) - \text{corr}_{Sync} - \text{corr}_{FollowUp} - \text{corr}_{DelayResp}]/2 \quad (1)$$

$$\begin{aligned}\text{offset} &= t_2 - t_1 - \text{delay} - \text{corr}_{Sync} - \text{corr}_{FollowUp} \\ &= [(t_2 - t_1) - (t_4 - t_3) - \text{corr}_{Sync} - \text{corr}_{FollowUp} + \text{corr}_{DelayResp}]/2\end{aligned} \quad (2)$$

where $t_1$ is the time stamp at which the master clock sends the synchronous message, $t_2$ is the time stamp at which the slave clock receives the synchronous message, $t_3$ is the time stamp at which the slave clock sends a delayed message, $t_4$ is the time stamp at which the master clock receives the delayed message, $\text{corr}_{Sync}$ is the synchronous message (Sync) correction field, $\text{corr}_{FollowUp}$ is the follow-up message (Follow_Up) correction field, $\text{corr}_{DelayResp}$ is the delayed response message (Delay_Resp) correction field.

As can be seen from the equations (1) and (2), the calculation of the timing offset (offset) and path delay (delay) depends on the time stamps $t_1$, $t_2$, $t_3$, $t_4$, and the correction fields of the synchronous, follow-up, and delayed response message.

The field of correction field in the message occupies 8 bytes, wherein the preceding 6 bytes are the integer bit, and the last 2 bytes are the decimal bit, and wherein the unit of the field is nanosecond. For example, 0x0000000000028000 indicates 2.5 nanoseconds. As can be seen from the equation (1), if the value of $\text{corr}_{FollowUp}$ is changed to 0x0000020000000000, namely $2^{25}$ nanosecond (about 33.6 milliseconds), while other variables in the equation are not changed, it may result in a sudden change of about 33.6/2=16.8 milliseconds in the path delay (delay). Similarly, when the synchronous message reaches the slave clock, there is also a sudden change about 16.8 milliseconds in the timing offset (offset) calculated by the slave clock.

In the method of the present application for invention, first of all, the IEEE1588 tester and the slave clock DUT forms a real-time closed-loop system, so that the IEEE1588 tester can detect the timing offset or path delay of the DUT in a real-time closed-loop. The real-time closed-loop may be realized in two ways, one of which is based on the PPS feedback to introduce into the IEEE1588 tester the PPS output from the slave clock DUT, and the other one of which is based on the IEEE1588 management mechanism.

During assembling an abnormal message in a frame, apart from the error in the designed message itself (e.g., an error in some field of the message), the field of correction field in the abnormal message should be assigned with a specifically designed abnormal value. Once the slave clock DUT receives such an abnormal message which should have been ignored, the field of correction field (correctionField) will "magnify" the timing offset or path delay of the slave clock DUT.

Prior to receiving the abnormal message, the IEEE1588 tester has recorded the timing offset or path delay of the slave clock DUT. When the slave clock DUT receives the abnormal message, the "magnified" timing offset or network delay significantly differs from the previous timing offset or path delay. As a result, it is possible to easily determine that the slave clock DUT has not ignored the abnormal message, i.e., the message processing logic of the slave clock DUT is not correct.

Figure 3:
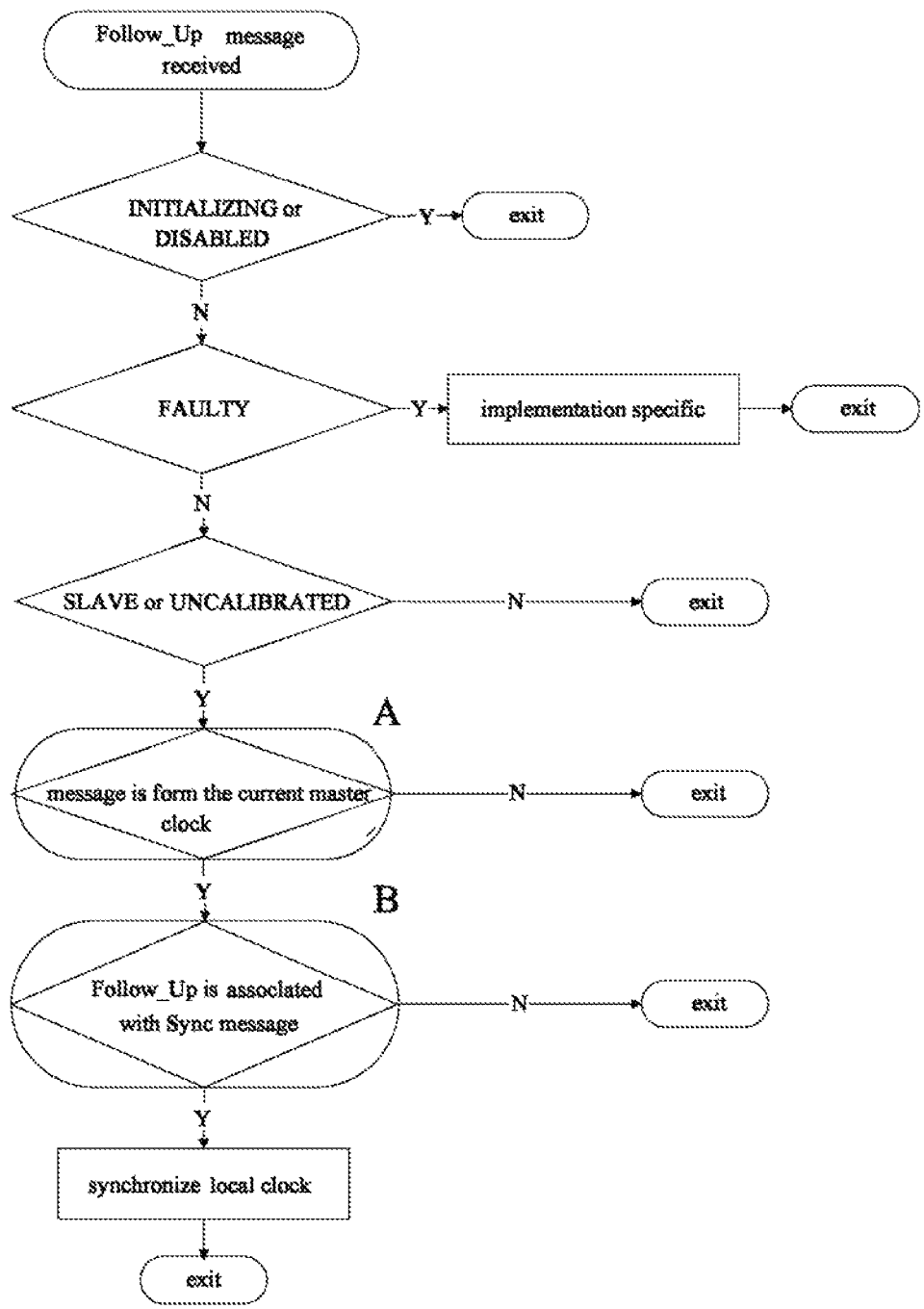
FIG. 3 is a flow chart showing how a slave clock device processes a follow-up message from a master clock as prescribed in the IEEE1588-2008 protocol.

With reference to the drawings, an embodiment of the present invention will be described hereinafter, i.e., an invalid follow-up message (Follow_Up) test. This embodiment is used to test whether the logic for the slave clock DUT to process the follow-up message is correct, and to verify the slave clock DUT can ignore the invalid follow-up message. FIG. 3 is FIG. 31 from the IEEE1588-2008 protocol, which prescribes the flow chart for the slave clock to process the follow-up message from the master clock. The processing items checked in this test are shown by the ellipse in the figure:

check item A (ellipse A): check whether the follow-up message comes from the current master clock; if NOT, it is required to ignore this frame of message; and check item B (ellipse B): check whether the follow-up message has the same message number as that of the associated synchronous message; if NOT, it is required to ignore this frame of message;

As shown in FIG. 1, the test system in this embodiment comprises an IEEE1588 tester and a slave clock DUT. The slave clock DUT is a device (e.g., a digital merging unit) having an accuracy of about microseconds in a smart substation. The slave clock DUT and the IEEE1588 tester both support a hardware time stamp. If the IEEE1588 tester and the slave clock DUT are connected directly via an optical fiber, the timing offset of the slave clock DUT normally is about tens of nanoseconds, and the calculated path delay is generally a few nanoseconds. Since the slave clock DUT is a device having an accuracy of about microseconds in the smart substation, and has a PPS outputting interface, the real-time closed-loop feedback adopts a PPS feedback mechanism for detecting whether there is a sudden change in the timing offset of the slave clock DUT. Of course, if the slave clock DUT supports the IEEE1588 management mechanism, the real-time closed-loop feedback can also adopt the IEEE1588 management mechanism, in which whether there is a sudden change in the path delay of the slave clock DUT is detected by a getting operation (GET command).

If the slave clock under test receives the abnormal follow-up message the correction field of which increases suddenly, the abnormal follow-up message is a disturbance to the synchronous process of the DUT. If the correction field of the follow-up message suddenly increases, it may result in the path delay suddenly increases, and the timing offset will suddenly increase subsequently. If the correction field of the following follow-up message does not change any longer, the path delay and timing offset will be stabilized quickly.

In this embodiment the slave clock DUT is connected directly with the IEEE1588 tester, the IEEE1588 tester as a master clock sends a normal follow-up message which has a correction field $corr_{FollowUp}$ of 0. The value of the correction field $corr_{FollowUp}$ of the abnormal follow-up message to be sent in the test is designed as 0x0000000004000000, i.e., 1024 nanoseconds. Then the value of $corr_{FollowUp}$ suddenly increases to 1024 nanoseconds, while the increments of other time stamps and correction field in the equation are relatively stable. According to equations (1) and (2), this may lead to a sudden change of 1024/2=512 nanoseconds in the timing offset and path delay. The sudden increment about 500 nanoseconds in the timing offset and path delay is sufficiently obvious, as compared with tens of nanoseconds of timing offset or a few nanoseconds of path delay in a normal synchronous situation. This can be easily identified by the IEEE1588 tester through the PPS feedback mechanism or the IEEE1588 management mechanism.

Figure 2:
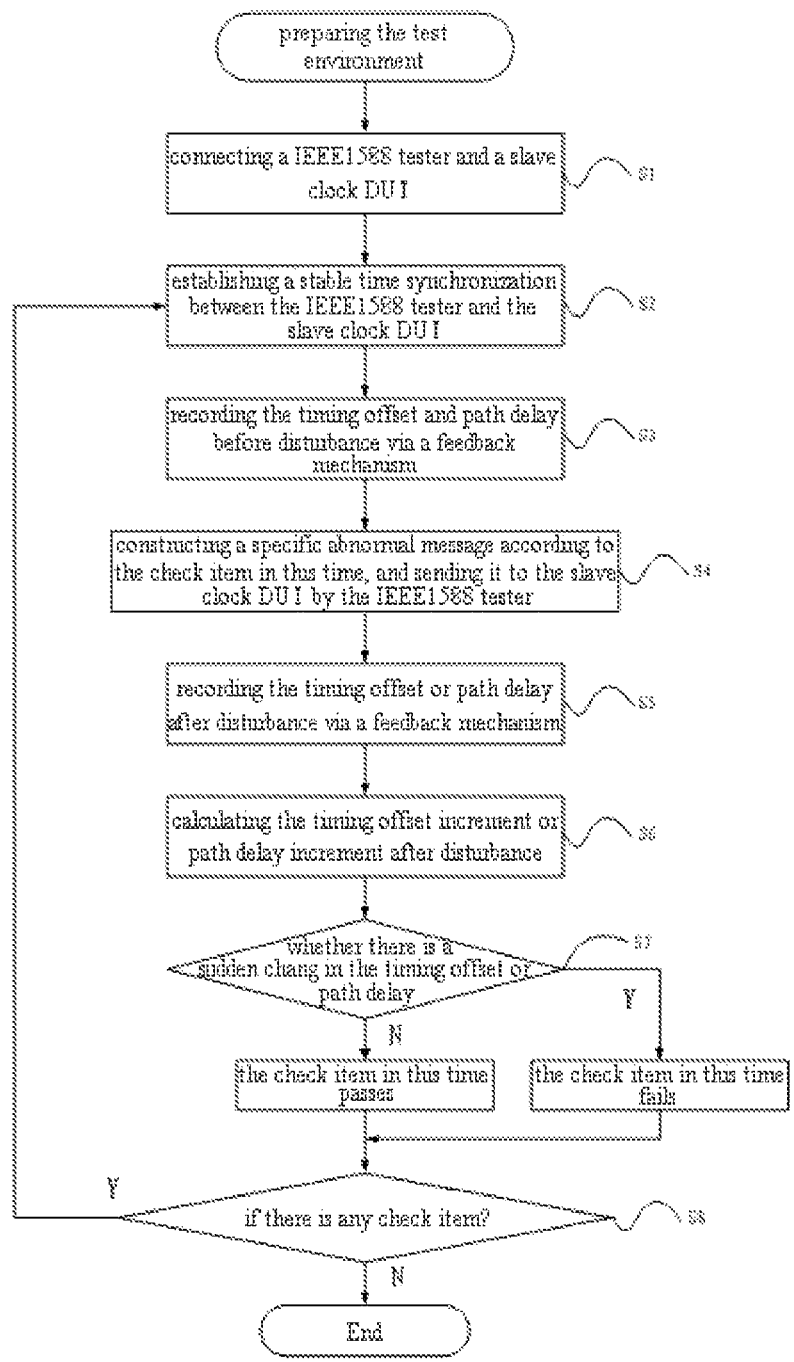
FIG. 2 is a flow chart showing a testing method according to an embodiment.

FIG. 2 is a flow chart showing the operation according to this embodiment, and the specific processes are described as follow:

Step S1: connecting the IEEE1588 tester and the slave clock DUT, to establish a real-time closed-loop feedback mechanism;

Step S2: taking the IEEE1588 tester as a master clock, and establishing a stable time synchronization with the slave clock DUT;

Step S3: recording the normal timing offset and normal path delay.

If the slave clock DUT supports the PPS signal output, the IEEE1588 tester finds out the timing offset of the slave clock device by comparing a reference PPS signal and the PPS signal output by the slave clock device, and records the normal timing offset of the slave clock device at this time;

If the slave clock DUT supports the IEEE1588 management mechanism, the normal path delay of the slave clock device at this time is recorded.

Step S4: constructing the specific abnormal message according to the check item in this time, and sending it to the slave clock DUT. Apart from some field is abnormal in this abnormal message, the correction field is also specifically designed for "magnifying" the response of the slave clock under test upon receiving the abnormal message.

Step S5: recording the timing offset and path delay after the abnormal message is inputted.

If the slave clock DUT supports the PPS signal output, the timing offset of the slave clock device at this time is recorded (disturb offset);

if the slave clock DUT supports the IEEE1588 management mechanism, the path delay of the slave clock device at this time is recorded (disturb delay).

Step S6: calculating the timing offset increment or path delay increment after the disturbance of the abnormal message.

If the slave clock DUT supports the PPS signal output, the timing offset increment is:

$$\text{delta offset}=|\text{disturb offset}-\text{normal timing offset}|$$

where, the disturb offset is the slave clock timing offset after disturbance, and the normal timing offset is the slave clock timing offset before disturbance.

If the slave clock DUT supports the IEEE1588 management mechanism, the path delay increment is:

$$\text{delta delay}=|\text{disturb delay}-\text{normal path delay}|$$

where the disturb delay is the slave clock path delay after disturbance, and the normal path delay is the slave clock path delay before disturbance.

Step S7: determining whether there is a sudden change in the timing offset or path delay.

According to the increment calculated in Step S6, it is determined whether there is a sudden change in the timing offset or path delay of the slave clock DUT. If there is no sudden change, it indicates that the logic for the slave clock DUT to process the abnormal message is correct, and the check item in this time passes; otherwise it indicates that the logic for the slave clock DUT to process the abnormal message is not correct, and the check item in this time fails.

Determining whether there is a sudden change in the path delay or timing offset of the slave clock DUT means in case that the slave clock DUT is disturbed (the abnormal message is inputted), the timing offset and path delay significantly differ from the normal case. Such a significant difference makes it possible for the IEEE1588 tester to easily identify through the real-time closed-loop feedback mechanism. Generally, the sudden change may be defined by that the timing offset or path delay is higher after disturbance than before disturbance by at least one order.

Step S8: if there is any check item, repeating Step S2 to Step S7.

If the check item in this time is A, i.e., it is checked whether the received follow-up message comes from the current master clock, see the ellipse A in FIG. 3. The source port identity field sourcePortIdentity of the follow-up message determines the master clock from which the follow-up message comes. This field comprises two parts, i.e., clock identity and clock port number. The clock identity reflects the MAC address of the master clock, while the clock port number indicates the port of the master clock from which the message comes. In this embodiment, the clock identity of the current master clock reflects the MAC address of the IEEE1588 tester, and the port number is 0. Therefore, in Step S4, it is required to construct the following abnormal follow-up message. The clock identity of the source port identity field for the follow-up message is set to be different from the normal clock identity in Step S2, and the port number may still be 0. At the same time, the correction field of the follow-up message is set as 0x0000000004000000 as described above, i.e., 1024 nanoseconds, and other fields are the same as those of the normal follow-up message. If the slave clock DUT does not determine (or determines falsely) whether the follow-up message comes from the master clock, it would receive this abnormal follow-up message, which may lead to sudden increase in the path delay and timing offset in Step S7. This indicates that the logic for the slave clock device to determine whether the follow-up message comes from the current master clock is not realized or is realized falsely.

If the check item in this time is B, i.e., it is verified whether the message number of the follow-up message coincides with that of the associated synchronous message, see the ellipse B in FIG. 3. Therefore, in Step S4, it is required to construct the following abnormal follow-up message. The message number of the follow-up message is set to be different from the message number of the latest received synchronous message (e.g., it is set the follow-up message number=the latest received synchronous message number+10). At the same time, the correction field of the follow-up message is set as 0x0000000004000000 as described above, i.e., 1024 nanoseconds, and other fields are the same as those of the normal follow-up message. If the slave clock DUT does not determine (or determines falsely) whether the follow-up message number is the same as that of the synchronous message, it would receive this abnormal follow-up message, which may lead to sudden increase in the path delay and timing offset in Step S7. This indicates that the logic for the slave clock device to determine whether the follow-up message number is the same as that of the synchronous message is not realized or is realized falsely.

As apparent from the embodiments described above, the testing method of the present invention relates to a general framework for realizing the IEEE1588 negative testing. As for the processing logic process of the specific message to be checked, whether the realization of a message processing link is correct is tested and verified in each run (by sending an abnormal message which is specifically designed for this link), so as to guarantee the IEEE1588 message processing logic of the DUT strictly follows IEEE1588-2008.

What is claimed is:

1. An IEEE1588 protocol negative testing method, characterized in that, the method comprises the following steps:
   (1) connecting a IEEE1588 tester and a slave clock DUT to establish a real-time closed-loop feedback mechanism;
   (2) taking the IEEE1588 tester as a master clock, and establishing a stable time synchronization with the slave clock DUT;
   (3) obtaining the timing offset or path delay of the slave clock DUT before disturbance through a real-time closed-loop feedback mechanism by the IEEE1588 tester;
   (4) assembling an abnormal message in a frame by the IEEE1588 tester, and sending it to the slave clock DUT;
   (5) obtaining the timing offset or path delay of the slave clock DUT after disturbance of the abnormal message through the real-time closed-loop feedback mechanism by the IEEE1588 tester;
   (6) calculating the timing offset increment or path delay increment after disturbance of the abnormal message;
   (7) according to the increment calculated in Step (6), determining whether there is a sudden change in the timing offset or path delay of the slave clock DUT, wherein if there is no sudden change, it indicates that the logic for the slave clock DUT to process the abnormal message is correct, and the check item in this time passes; otherwise it indicates that the logic for the slave clock DUT to process the abnormal message is not correct, and the check item in this time fails.

2. The IEEE1588 protocol negative testing method according to claim 1, characterized in that: the real-time closed-loop feedback mechanism in said step (1) is a PPS feedback mechanism or an IEEE1588 management mechanism.

3. The IEEE1588 protocol negative testing method according to claim 2, characterized in that: the IEEE1588 tester receives a GPS signal and obtains a reference PPS signal, the slave clock DUT has a PPS signal outputting interface, the PPS signal is introduced into the IEEE1588 tester, the IEEE1588 tester finds out real-time timing offset of the slave clock device by comparing the reference PPS signal and the PPS signal output by the slave clock device.

4. The IEEE1588 protocol negative testing method according to claim 2, characterized in that: both the IEEE1588 tester and the slave clock DUT support the IEEE1588 management mechanism, and the IEEE1588 tester serves as an administrative client and can obtain the path delay of the slave clock DUT at any time by a getting operation GET command in the management mechanism.

5. The IEEE1588 protocol negative testing method according to claim 2, characterized in that:
   if the slave clock DUT has a PPS signal outputting interface, said real-time closed-loop feedback mechanism selects the PPS feedback mechanism, and determines in step 7 whether there is a sudden change in the timing offset; and
   if the slave clock DUT supports the IEEE1588 management mechanism, said real-time closed-loop feedback mechanism selects the IEEE1588 management mechanism, and determines in step 7 whether there is a sudden change in the path delay.

6. The IEEE1588 protocol negative testing method according to claim 1, characterized in that: during assembling an abnormal message in a frame in said step (4), apart from the error in the designed message itself, the field of correction field in the abnormal message is further assigned with an abnormal value, and once the slave clock DUT receives such an abnormal message which should have been ignored, the field of correction field will "magnify" the timing offset or path delay of the slave clock DUT.

7. The IEEE1588 protocol negative testing method according to any one of claims 6, characterized in that: determining whether there is a sudden change in the path delay or timing offset of the slave clock DUT in said step (7) means in case that the slave clock DUT is disturbed, that is, the abnormal message is inputted, the timing offset and path delay significantly differ from the normal case, and such a significant difference makes it possible for the IEEE1588 tester to easily identify through the real-time closed-loop feedback mechanism.

8. The IEEE1588 protocol negative testing method according to claim 7, characterized in that: said sudden change means that the timing offset or path delay is higher after disturbance than before disturbance by at least one order.

* * * * *